United States Patent [19]
Kim

[11] Patent Number: 5,387,533
[45] Date of Patent: Feb. 7, 1995

[54] METHOD OF MAKING DYNAMIC RANDOM ACCESS MEMORY

[76] Inventor: Hong S. Kim, Dae-dong 109-27, dong-ku, Taejeon-si, Rep. of Korea

[21] Appl. No.: 109,520

[22] Filed: Aug. 20, 1993

[30] Foreign Application Priority Data

Aug. 25, 1992 [KR] Rep. of Korea ............... 1992-15306

[51] Int. Cl.6 .......................................... H01L 21/70
[52] U.S. Cl. ...................... 437/52; 437/47; 437/60; 437/919
[58] Field of Search .................. 437/47, 48, 52, 60, 437/919; 257/303

[56] References Cited

U.S. PATENT DOCUMENTS 5,118,640  6/1992  Fujii et al. ........................... 437/52
5,174,858 12/1992  Yamamoto et al. ................. 437/52

Primary Examiner—Tom Thomas

[57] ABSTRACT

A DRAM having a dual cell plate structure and a method of making this DRAM are provided. The DRAM is made by forming two field insulation films with a constant interval on a semiconductor substrate and forming word lines uniformly spaced from each other along with the associated bit lines. The specific structure and method for this DRAM reduces the parasitic capacitance between the bit lines and the word lines so that the fabrication of the DRAM may be easily performed.

16 Claims, 7 Drawing Sheets

METHOD OF MAKING DYNAMIC RANDOM ACCESS MEMORY

BACKGROUND OF THE INVENTION

The present invention relates to a method of making a dynamic random access memory and more particularly to a method of making a dynamic random access memory with dual cell plate structure.

Conventionally, a dynamic random access memory (DRAM) cell has a capacitor and a metal oxide semiconductor(MOS) transistor.

The capacitor has a plate node, a storage node and a dielectric film. The MOS transistor has a source electrode, a drain electrode and a gate electrode.

In the above mentioned DRAM cell, since the DRAM cell only has a capacitor and a MOS transistor, it is possible to considerably reduce the cost in manufacturing the DRAM cell for each bit and to advantageously store a large quantity of information.

Therefore, DRAM has been widely used as not only the main storage memory of large-sized computers but also the memory element of personal computers. Presently, the capacitor is the key in designing a DRAM cell. So as to store information, the capacitor should be designed such that the capacitor has a capacitance as large as possible.

Also, so as to have a large capacitance, the capacitor should be designed such that it has an area as wide as possible and a dielectric film as thin as possible.

Further, the capacitor should be designed such that the capacitor has a junction capacitance with a storage electrode as high as possible and a junction capacitance with a bit line as low as possible.

Referring to FIGS. 1a, 1b and FIGS. 2a to 2f, there is illustrated a method of making a conventional DRAM with a dual capacitor-plate cell (hereinafter, DCP structure) which satisfies the above-conditions.

First, FIG. 1a shows a plane view of a one bit DRAM cell having a DCP cell structure.

FIG. 1b shows a cross sectional view taken along a line A—A' of FIG. 1a.

A method of making a conventional DRAM with a DCP cell structure shown in FIG. 1a, 1b will be hereinafter described, in conjunction with FIGS. 2a to 2f.

Referring to FIGS. 2a to 2f, there are shown key process steps of making the conventional DRAM shown in FIGS. 1a and 1b.

As shown in FIG. 2a, first, capacitor buried contacts are opened after the formation of a bit line 1. A polysilicon buffer layer 2 is then delineated.

As show in FIG. 2b, chemical vapour deposition (CVD) oxide 3 is deposited and the surface becomes plane by the oxide etch back technique.

Then, the triple layer of lower cell plate 4 of 200 nm thick polysilicon, first thin dielectrics 5 of oxide-nitride-oxide film(teff=5 nm) and storage node 6 of 500 nm thick polysilicon are deposited successively. As shown in FIG. 2c, capacitor contact holes 7 are opened through these composite layers to the polysilicon buffer layer 2.

Subsequently, as shown in FIG. 2d, CVD oxide 8 having a thickness of 100 nm is deposited and etched by anisotropic etching to make the self aligned sidewall dielectrics 9 in the capacitor contact holes 7. These sidewall dielectrics 9 electrically isolate the storage node 6 and the lower cell plate 4.

Subsequently, thin polysilicon film 10 having a thickness of 100 nm thick is deposited to connect the polysilicon buffer layer 2 and the polysilicon storage node 6, as shown in FIG. 2e.

The storage node resist patterns are delineated and the polysilicon storage node 6 is etched by the reactive ion etch(RIE) technique to a desired pattern. This etching of polysilicon is stopped at the thin ONO film 5 as a result of the high selective etching of polysilicon in comparison to oxide.

The formation of a second ONO film 11 having an effective oxide thickness of 5 nm is performed.

As shown in FIG. 2f, the upper cell plate node 12 of polysilicon having a thickness of 300 nm thick is deposited.

At this time,the capacitor contact holes 7 and the isolation spaces between storage nodes are filled by this upper cell plate node 12.

Therefore, the surface of cell array becomes plane automatically.

According to FIG. 26, as mentioned above, the CVD oxide 3 is deposited and the contact holes 7 are opened.

Also, the first aluminum layer, that is, the bit line 1 stitches the polysilicon word line to reduce the word line resistance for improved speed performance.

One of the advantages of this process is that no extra mask process is necessary to fabricate this cell structure to the conventional stacked capacitor cell with the exception of the polysilicon buffer layer 2.

Another advantage is that the storage capacitors above can be delineated easily on the relatively flat surface for their patterning.

Also, it is possible to obtain capacitors having areas which are relatively wider than that of the conventional capacitors.

According to the conventional method, however, since the thicknesses of the word line and the insulation film (for example, CVD oxide) are self-aligned and hence limited automatically, there are disadvantages in that the parasitic capacitance between the word line and the bit line becomes large and the word line may be shorted to the bit line.

SUMMARY OF THE INVENTION

Therefore, an object of the invention is to eliminate the above-mentioned disadvantages encountered in the conventional methods and to provide a method of making a DRAM capable of reducing the parasitic capacitance between the bit line and the word line and also easily performing the fabrication processes of the DRAM.

In one embodiment, the present invention provides a method of making a DRAM comprising the steps of:

forming first and second field insulation films with a constant interval on a semiconductor substrate, to define an active region;

forming word lines uniformly spaced from each other by two respectively on the first and second field insulation films and the active region, wherein each word line includes side wall insulation films at side walls thereof;

forming a third insulation film for a capacitor contact on the exposed whole surface and then removing portions formed between the word lines of the active region and the word lines of said first and second field insulation films, of the third insulation film, to form capacitor contact holes;

implanting an impurity on the semiconductor substrate through the capacitor contact holes, to form impurity regions in the surface of the semiconductor substrate;

thickly forming a first conductor for a plug on the exposed whole surface and then etching-back the first conductor for the plug until the insulation film for the capacitor contact is exposed, thereby forming plug conductors on the surface of the third insulation film for the capacitor contact and in the capacitor contact holes and planarizing the exposed whole surface;

forming a fourth insulation film for a buffer on the exposed whole surface and removing a portion formed between two word lines of the active region, of the fourth insulation film for the buffer, the remaining third insulation film for the capacitor contact and the plug conductors, to form a bit line contact;

forming a second conductor for a bit line contact hole and a fifth insulation film for bit line definition, in this order, on the exposed whole surface so that the bit line contact hole is filled by the second conductor and the fifth insulation film, wherein the second conductor for the bit line contact hole and the insulation film for bit line definition have a planarizing surfaces, respectively;

covering a first etch mask having a width wider than a width of the bit line contact on the upper portion of the bit line contact hole, of the surface of the fifth insulation film for bit line definition, and then etching the insulation film for bit line definition, the second conductor for the bit line and the fourth insulation film for the buffer to form a bit line;

removing the first etch mask and then a sixth insulation film for bit line insulation, a third conductor for a plate node having a planarizing surface and a seventh insulation film for capacitor definition, in this order, on the exposed whole surface;

forming a second etch mask having a width that is the same as a width of the first etch mask of an upper part of the bit line, of the surface of the seventh insulation film for capacitor definition, and then etching the third conductor for the plate node and the seventh insulation film for capacitor definition;

forming a first dielectric film for capacitor dielectric and a fourth conductor for the storage node, in this order, on the exposed whole surface and then etching the first dielectric film and the fourth conductor together with the insulation film for bit line insulation so that portions formed at the side walls of the remaining third conductor for the plate node and the seventh insulation film for capacitor definition merely remain;

forming a fifth conductor for the storage node on the exposed whole surface and then patterning the fifth conductor to merely remove a portion formed at the surface of the remaining seventh insulation film for capacitor definition and thus complete the storage node;

forming a second dielectric film for a capacitor dielectric on the exposed whole surface and then removing the remaining seventh insulation film for capacitor definition and the second dielectric film formed on the seventh insulation film to complete a capacitor dielectric; and forming a sixth conductor on the exposed whole surface to complete the plate node.

BRIEF DESCRIPTION OF THE DRAWINGS

Other objects and aspects of the invention will become apparent from the following description of embodiments with reference to the accompanying drawings in which:

FIG. 1b is a cross-sectional view taken along the line A—A' of FIG. 1a;

DETAILED DESCRIPTION OF THE PREFERRED EMBODIMENT

Figure 1A:
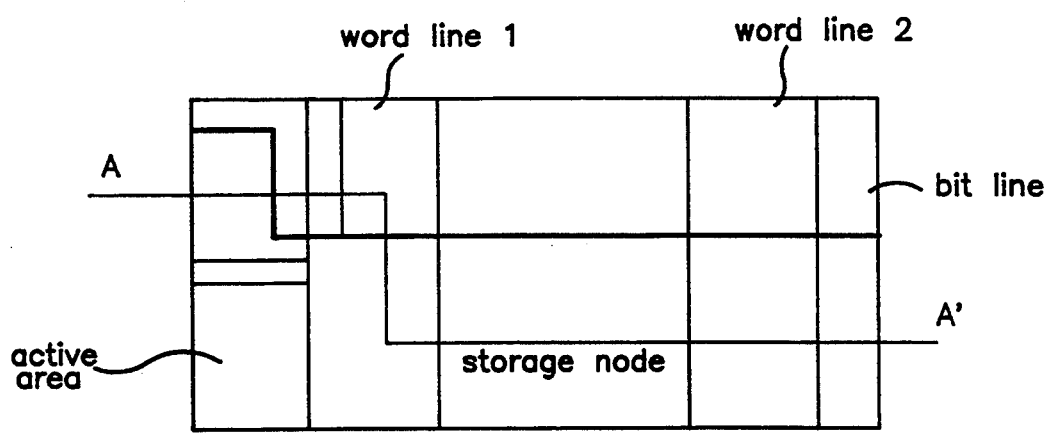
FIG. 1a is a layout diagram of a conventional DCP DRAM cell.
Figure 1B:
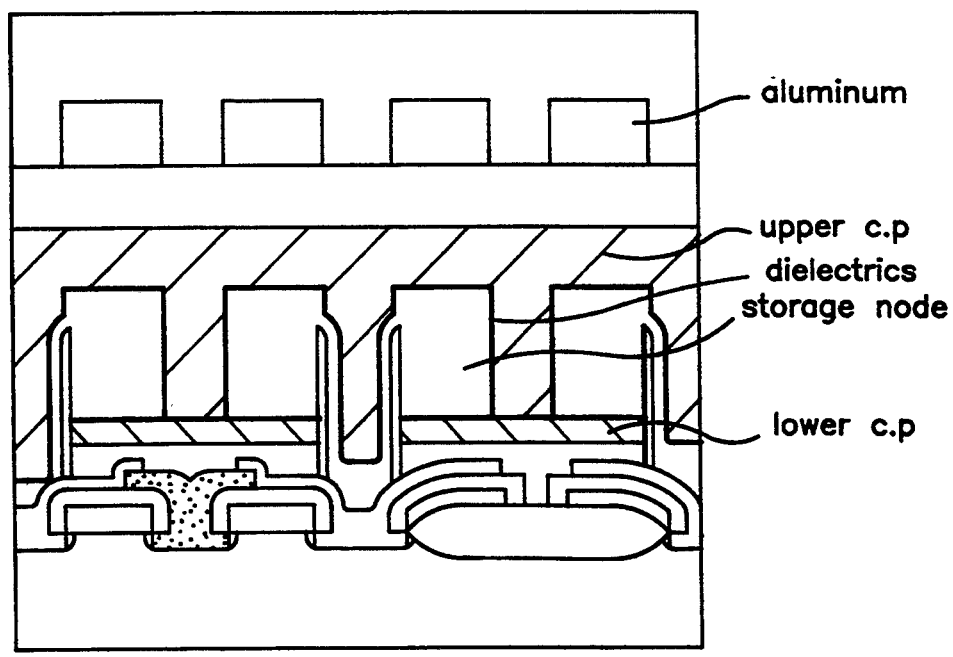
Figure 2A:
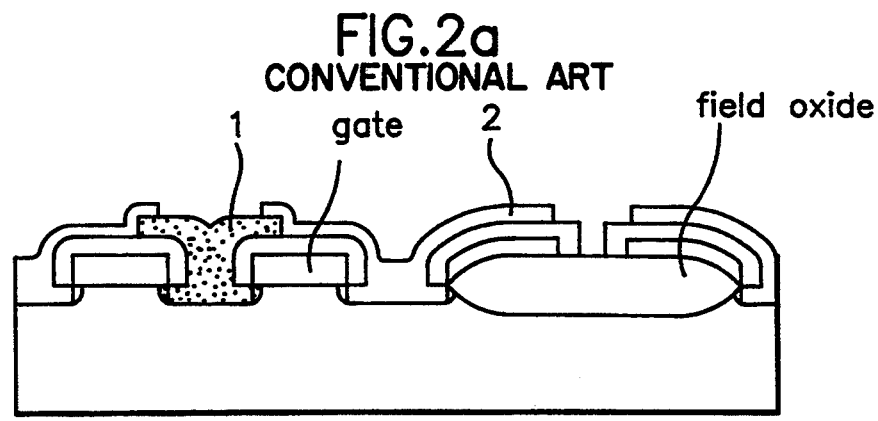
FIGS. 2a to 2f are cross-sectional views taken along the line A—A' of FIG. 1a showing a method of making a conventional DRAM.
Figure 2B:
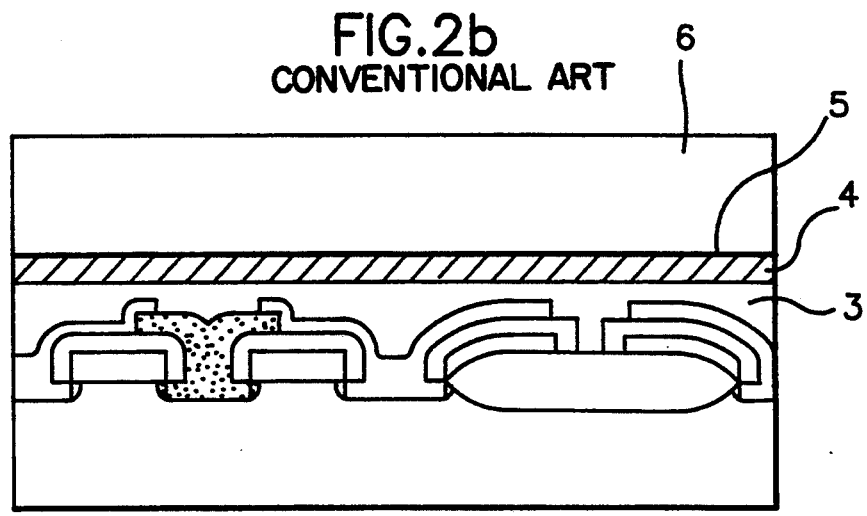
Figure 2C:
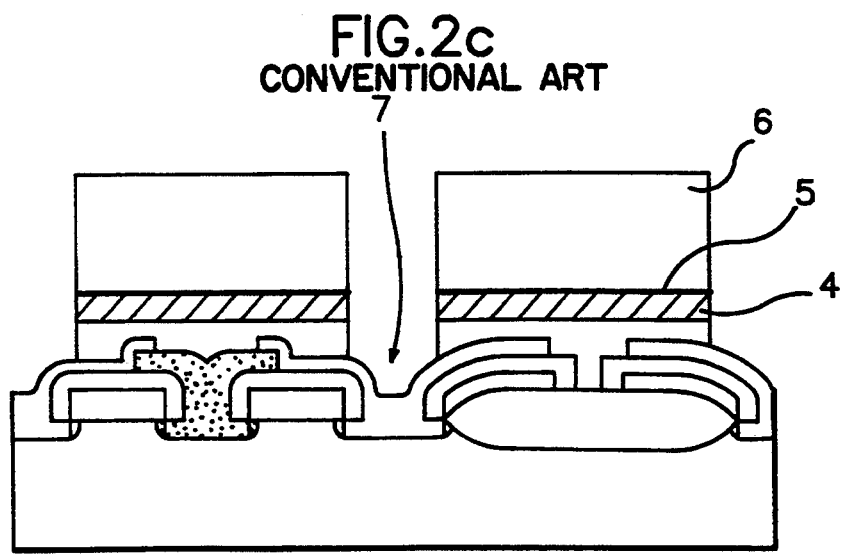
Figure 2D:
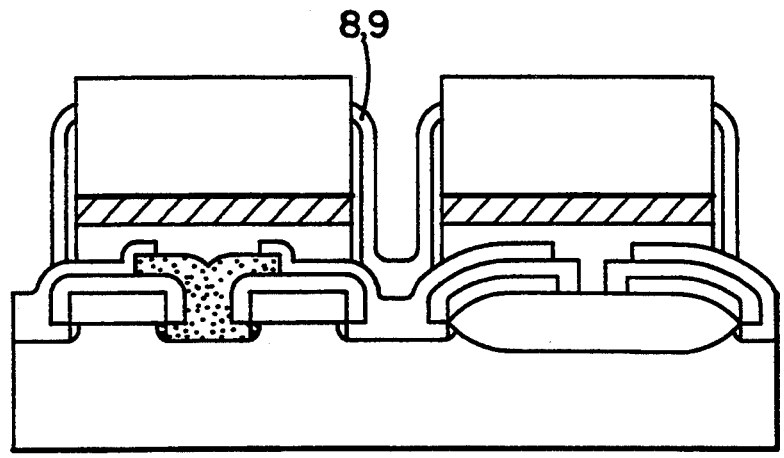
Figure 2E:
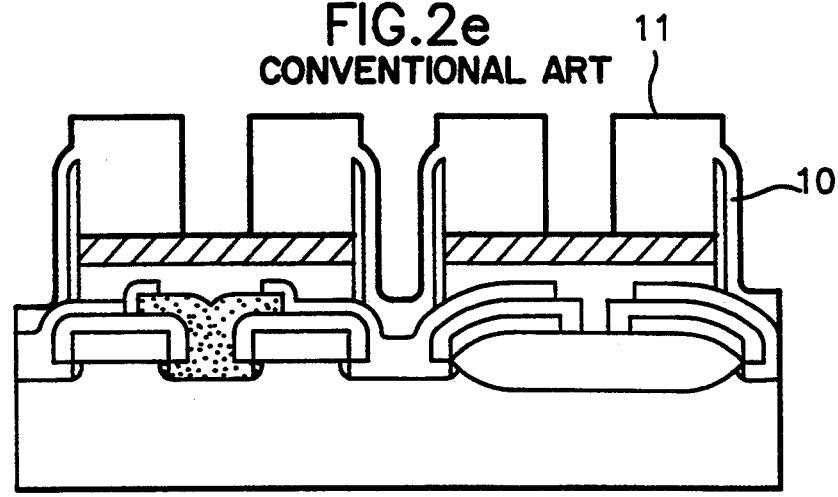
Figure 2F:
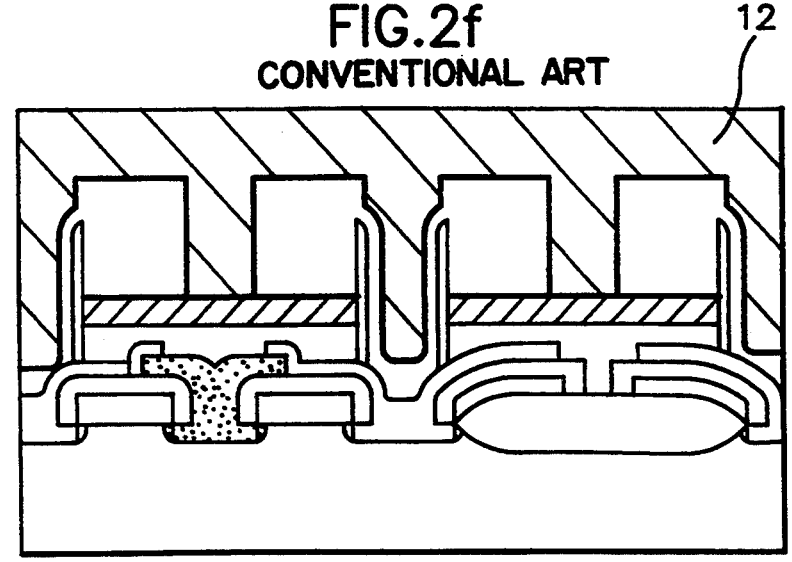
Figure 3:
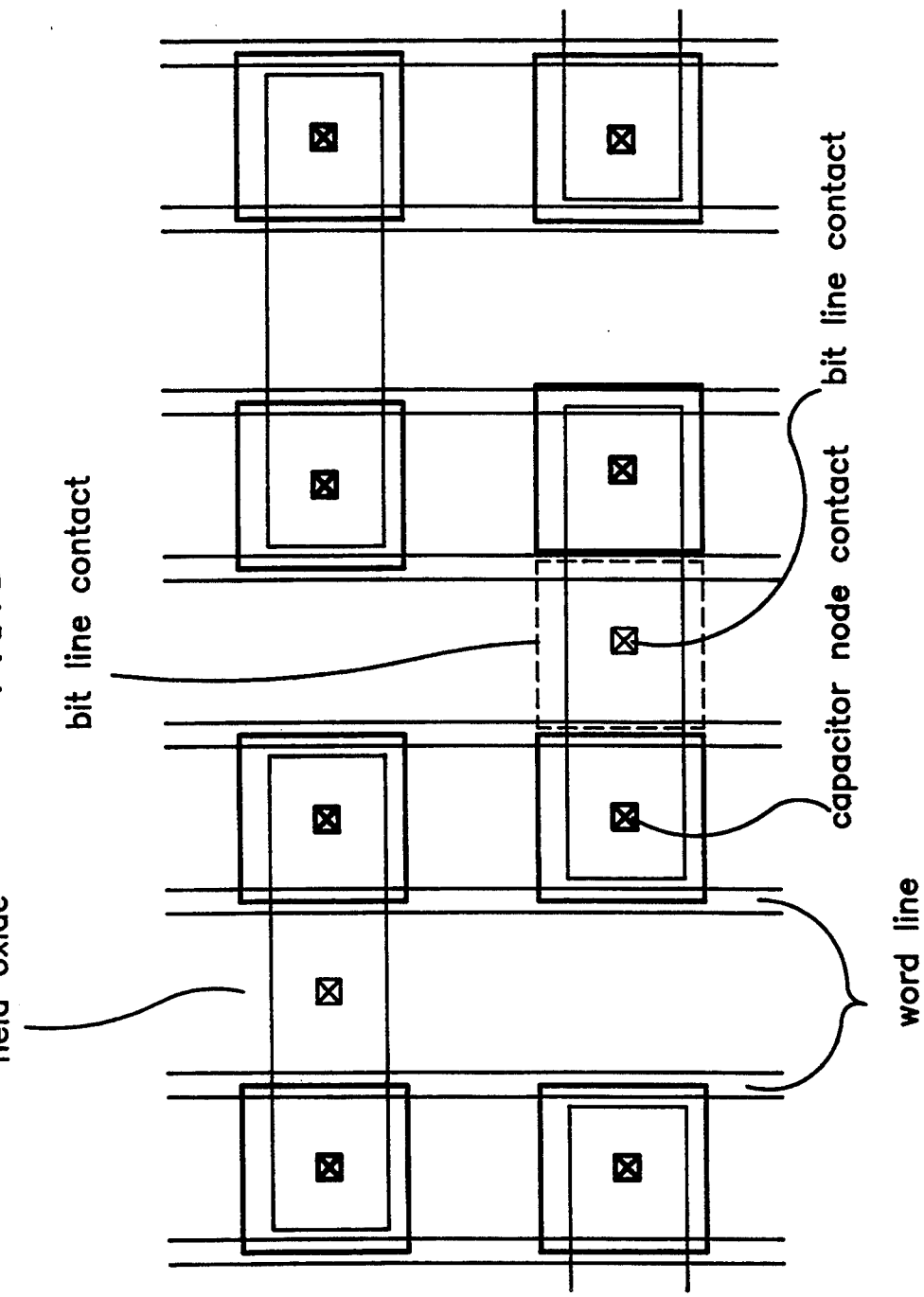
FIG. 3 is a layout diagram of a DRAM having DCP cell structure in accordance with an embodiment of the present invention.

Referring to FIGS. 3 to 4, there is illustrated a method of making a DRAM according to an embodiment of the present invention.

FIG. 3 is provided to show a layout diagram of a DRAM in accordance with an embodiment of the present invention.

FIGS. 4a to 4k are cross-sectional views showing a method of making a DRAM in accordance with an embodiment of the present invention.

Figure 4A:
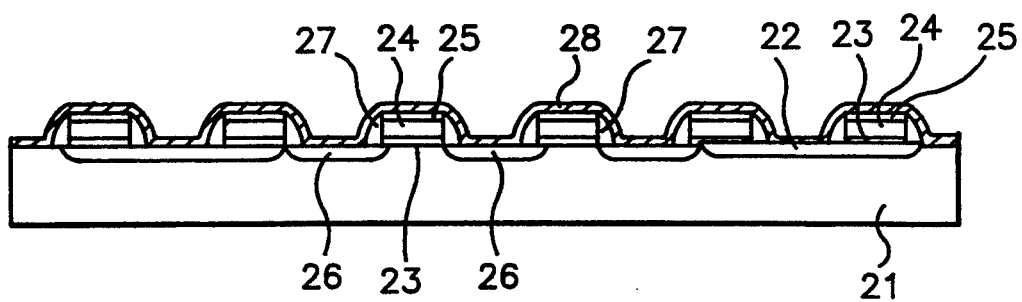
FIGS. 4a to 4k are cross-sectional views showing a method of making a DRAM having DCP cell structure in accordance with an embodiment of the present invention.

First, two field insulation films 22 for defining an active region are formed with a constant interval on a semiconductor substrate 21, using a local oxidation of silicon(LOCOS) method, as shown in FIG. 4a.

Subsequently, a first thermal insulation film is thermally formed on the whole surface of the semiconductor substrate 21, including the field insulation films 22 and then a first conductor and a second CVD insulation film are formed, in this order, on the surface of the first thermal insulation film, using a chemical vapour deposition(CVD) method.

Subsequently, the first thermal insulation film, the first conductor and the second CVD insulation film are subjected to a patterning process including a photolithography process and an etch process, using a gate mask.

As a result, word lines are formed uniformly spaced from each other respectively on the active region and the two field insulation films 22.

As shown in FIG. 4a each word line includes a gate insulation film 23 formed on the semiconductor substrate 21, a gate electrode 24 formed on the gate insulation film 23 and a gate cap insulation film 25 formed on the gate electrode 24.

Subsequently, a conductivity type of impurity ions are implanted on the semiconductor substrate 21 using each of the word lines as masks for impurity implantation, thereby forming impurity regions 26 serving as source regions and drain regions in the surface of the semiconductor substrate 21 corresponding to the area between the word lines.

Subsequently, a third insulation film is deposited on the whole surface of the semiconductor substrate 21 including the word lines and the field insulation films 22 using a CVD method and then etched-back by a reactive ion etching RIE method to form side wall insulation films 27 at the side walls of the word lines.

Thereafter, a fourth CVD insulation film 28 is deposited on the exposed whole surface of the semiconductor substrate 21 including the side wall insulation films 27 and the word lines, using a CVD method.

Here, silicon can be used as a material of the semiconductor substrate 21.

An oxide or a nitride can be used as a material of the first thermal insulation film to the fourth CVD insulation film.

Also, a metal or a polysilicon doped with an impurity can be used as a material of the first conductor.

Figure 4B:
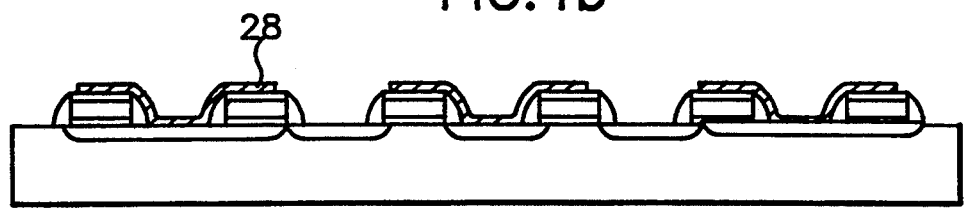

Subsequently, the fourth CVD insulation film 28 is selectively etched to merely remove a portion located between the word lines formed on the field insulation films 22 and the word lines formed on the active region, thereby forming capacitor contact holes between the word lines formed on the field insulation films 22 and the word lines formed on the active region, as shown in FIG. 4b.

At this time, there merely remains portions of the fourth CVD insulation film 28 which are located between the word lines formed on the field insulation films 22 and between the word lines formed on the active region.

Storage nodes of the capacitor will thereafter be formed in the capacitor contact holes.

Here, an oxide or a nitride can be used as a material of the fourth CVD insulation film 28.

Figure 4C:
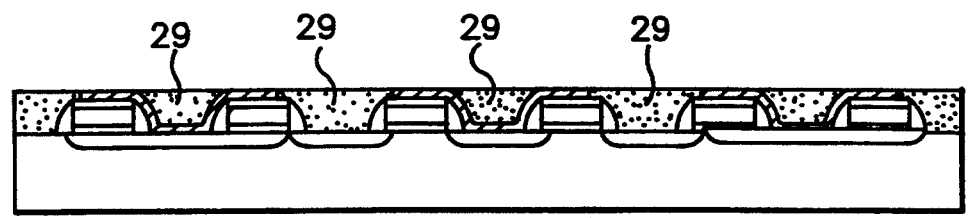

As shown in FIG. 4c, thereafter, a second conductor is deposited on the exposed whole surface using a CVD method and then etched-back uniformly until the surface of the fourth CVD insulation film 28 is exposed, thereby forming conductor plugs 29 in the capacitor contact holes and on the surface of the remaining fourth CVD insulation film 28 which are located between the word lines formed on the field insulation films 22.

At this time, the exposed whole surface is planarized.

Here, a metal or a polysilicon doped with an impurity can be used as a material of the second conductor.

Figure 4D:
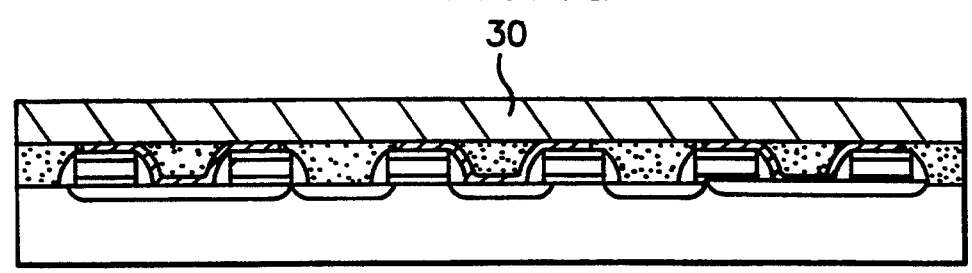
Figure 4E:
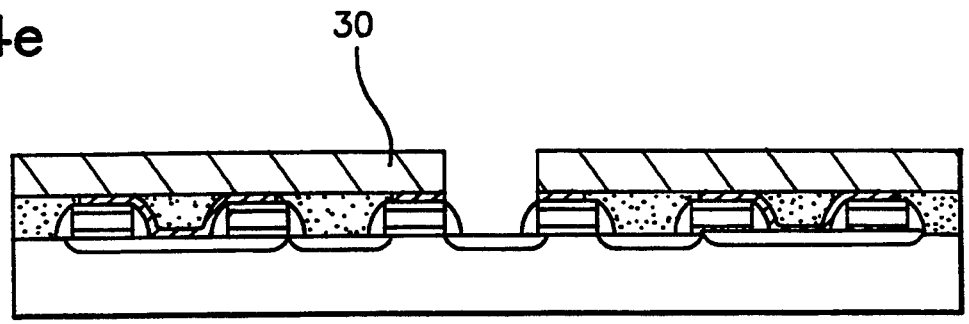

Subsequently, a fifth CVD insulation film 30 for a buffer layer is thickly deposited on the exposed whole surface as shown in FIG. 4d and then patterned to remove a portion between two word lines of the active region.

Upon patterning the fifth CVD insulation film 30, a dry etch process is used.

Thereafter, a wet etch is performed using the fifth insulation film 30 for a buffer layer as an etch mask, to remove a portion of the conductor plug 29 and a portion of the remaining fourth CVD insulation film 28 formed between two word lines of the active region.

Thus, a bit line contact hole is formed between two word lines of the active region.

Figure 4F:
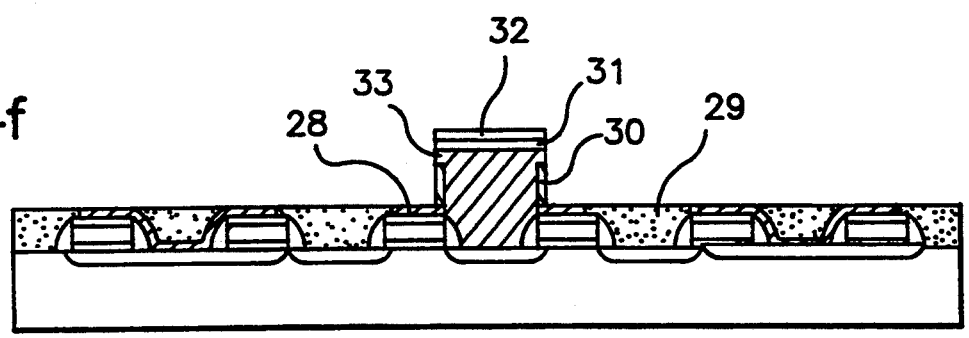

As shown in FIG. 4f, subsequently, a third conductor having a planarizing surface is deposited using a CVD method on the exposed whole surface including the remaining fifth insulation film 30 for a buffer layer and the bit line contact hole so that the bit line contact hole is filled completely.

A sixth CVD insulation film 31 for bit line definition is deposited on the third conductor using a CVD method.

Subsequently, an etch mask 32 for bit line definition having a width wider than that of the bit line contact hole is formed on a portion corresponding to the upper side of the bit line contact hole, of the surface of the sixth CVD insulation film 31, and then the sixth CVD insulation film 31, the third CVD conductor and the fifth CVD insulation film 30 for a buffer layer are etched together, thereby forming a bit line 33 in the bit line contact hole.

At this time, on the surface of the bit line 33, a portion of the sixth CVD insulation film 31 remains and at the side walls of the bit line 33, a portion of the fifth CVD insulation film 30 for a buffer layer remains.

Figure 4G:
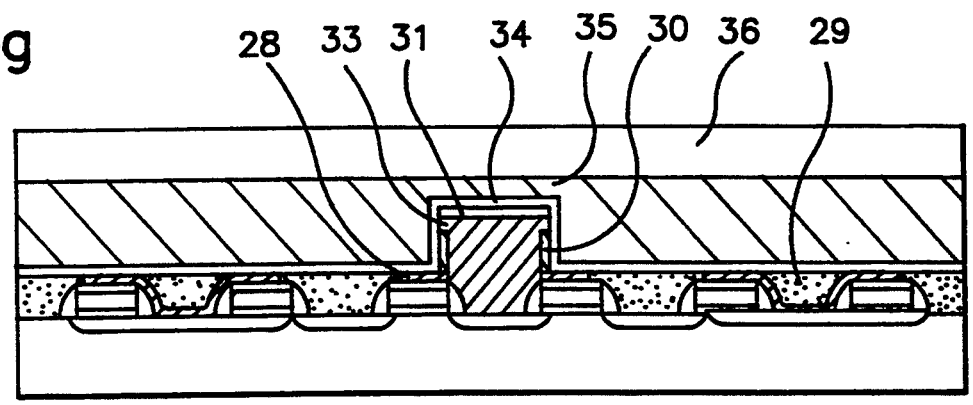

As shown in FIG. 4g, subsequently, the etch mask 32 is removed and then a seventh CVD insulation film 34 for bit line insulation is deposited on the exposed whole surface using a CVD method.

Thereafter, a fourth conductor 35 for a capacitor plate node having a planarization surface is formed on the seventh CVD insulation film 34 using a CVD method and then a eight CVD insulation film 36 for capacitor definition is deposited on the fourth CVD conductor 35 using a CVD method.

Here, a metal or a polysilicon doped with an impurity can be used as a material of the third conductor and the fourth conductor.

An oxide or a nitride can be used as a material of the fifth thermal insulation film 30 to the eighth CVD insulation film 36.

Figure 4H:
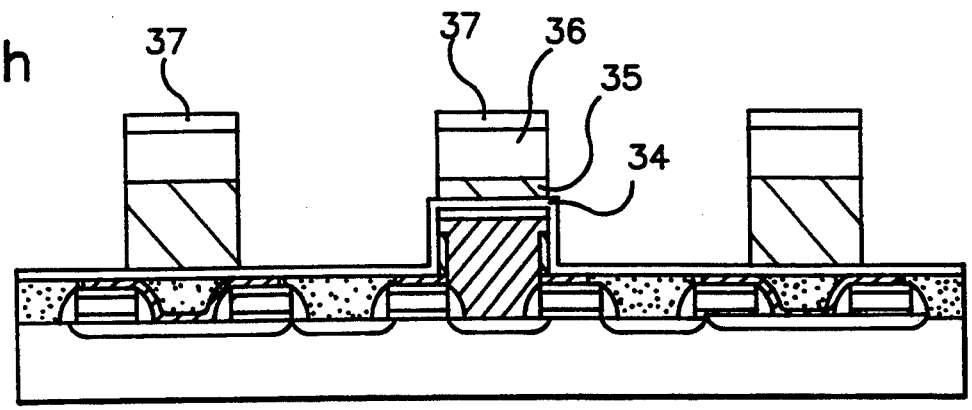

As shown in FIG. 4h, subsequently, an etch mask 37 is formed at a portion between two word lines formed on the field insulation films 22 and a portion corresponding to the upper side of the bit line 33, of the surface of the eighth CVD insulation film 36, and then the fourth CVD conductor 35 and the eighth CVD insulation film 36 are etched, thereby a portion formed in the upper side of the bit line 33 and portions formed between two word lines of the field insulation film 22 merely remains.

The remaining fourth CVD conductor 35 serves as the plate node.

Figure 4I:
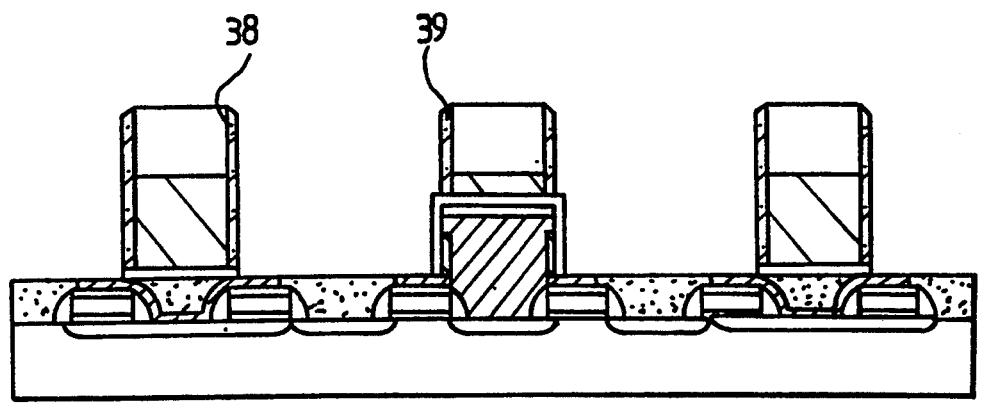

As shown in FIG. 4i, subsequently, the etch mask 37 is removed and then a first CVD dielectric film 38 and a fifth CVD conductor 39 for the storage node are deposited, in this order, using a CVD method. Thereafter, the first CVD dielectric film 38, the fifth CVD conductor 39 and the seventh CVD insulation film 34 are etched by a reactive ion etching (RIE) method, thereby portions formed at the side walls of the remaining fourth CVD conductor 35, the eighth CVD insulation film 36 and the seventh CVD insulation film 34 merely remain.

In a similar manner to the above case, a metal or a polysilicon doped with an impurity can be used as a material of the fifth CVD conductor 39 and an oxide or a nitride can be used as a material of the CVD insulation films.

Figure 4J:
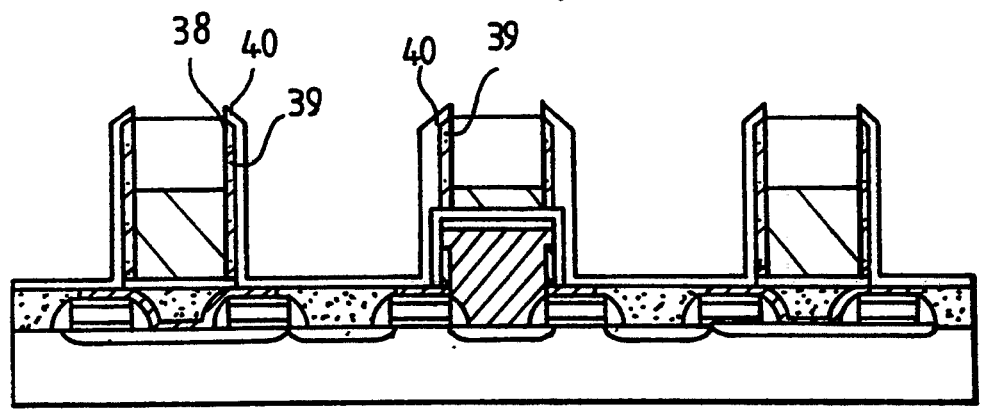

As shown in FIG. 4j, subsequently, a sixth conductor 40 for a storage node is deposited on the exposed whole surface and then patterned with a photolithography process and an etch process, thereby merely removing portions formed on the remaining eighth CVD insulation film 36.

At this time, the remaining sixth conductors 40 for the storage node are connected to the conductor plugs 29 formed in the capacitor contact holes and the remaining fifth CVD conductors 39 are connected to the remaining sixth CVD conductors 40.

The connected conductors 29,39,40 serve as the storage node of the capacitor.

Figure 4K:
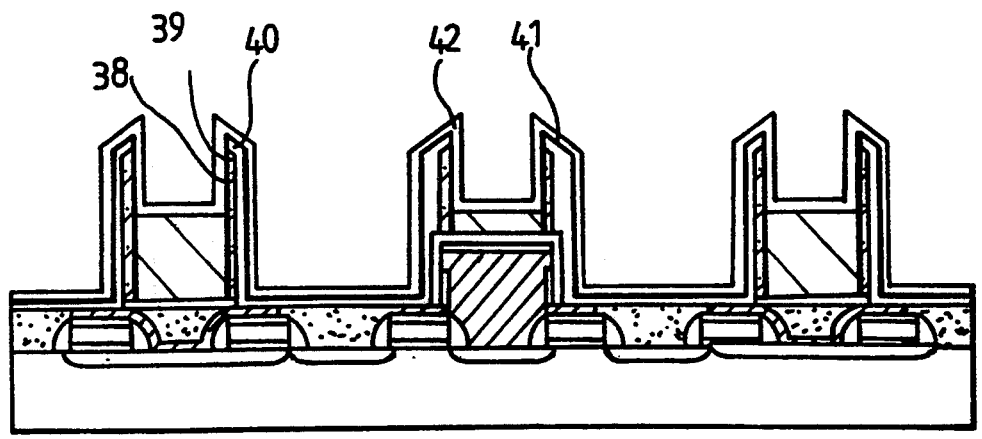

As shown in FIG. 4k, subsequently, a second dielectric film 41 is formed and then the remaining eighth CVD insulation film 36 and a portion of the second dielectric film 41 formed on the remaining eighth CVD insulation film 36 are removed.

Subsequently, a seventh conductor 42 is deposited on the exposed whole surface, using a CVD method.

At this time, the remaining second CVD dielectric film 41 is connected to the remaining first CVD dielectric film 38 and the connected dielectric films 38, 41 serve as the dielectric film of the capacitor.

Also, the seventh CVD conductor 42 is connected to the remaining fourth CVD conductor 35 and the connected conductors 35, 42 serve as the plate node of the capacitor.

As mentioned above, the storage node of the capacitor includes the remaining first and second conductors 39,39,40, the dielectric film of the capacitor includes the remaining first and second dielectric films 38,41 and the plate node of the capacitor includes the remaining fourth and seventh conductors 35,42.

As above mentioned, also, all of the above conductors can be made of a polysilicon doped with an impurity or a metal and all of the above insulation films can be made of an oxide or a nitride.

Also, the first and second dielectric films 38,41 can be made of a stack structure of thin insulation films such as oxide-nitride(O-N), nitride-oxide(N-O) and oxide-nitride-oxide (O-N-O).

According to the embodiments of present invention, it is possible to obtain the following advantages.

First, since the bit line contact is formed after planarizing the exposed whole surface by forming the conductor plug 29, it is possible to stably form the bit line contact.

Second, since the fourth CVD insulation film 28, the conductor plug 29 and the fifth CVD insulation film 30 for a buffer layer are made of materials having an etch selectivity different from each other, it is possible to reduce surface defects of the semiconductor substrate 21 upon the formation of the bit line contact.

Third, since the fifth insulation film 30 for a buffer layer remains between the word line and the bit line, it is possible to reduce the parasitic capacitance occurring between the word line and the bit line and also to prevent shorts of between the bit line and the word line.

Fourth, since the area of the capacitor is increased as compared with the conventional art, it is possible to increase the capacitance of the capacitor.

What is claimed is:

1. A method of making a DRAM comprising the steps of:
   (a) forming first and second field insulation films with a constant interval on a top surface of a semiconductor substrate, to define an active region;
   (b) forming word lines uniformly spaced from each other respectively on said first and second field insulation films and said active region, wherein each word line includes side wall insulation films at side walls thereof;
   (c) forming a third insulation film for a capacitor contact by exposing a third insulation pattern on said top surface and then removing portions formed between the word lines of the active region and the word lines of said first and second field insulation films, of said third insulation film, to form capacitor contact holes;
   (d) implanting an impurity on the semiconductor substrate through the capacitor contact holes, to form impurity regions in the surface of the semiconductor substrate;
   (e) forming a first conductor of a predetermined thickness for a plug by exposing a first conductor pattern on said top surface and then etching-back the first conductor for said plug until said third insulation film for the capacitor contact is exposed, thereby forming plug conductors on the surface of said third insulation film for the capacitor contact and in the capacitor contact holes and planarizing the entirety of said top surface;
   (f) forming a fourth insulation film for a buffer layer by exposing a fourth insulation pattern on said top surface and removing a portion formed between two word lines of the active region, of said fourth insulation film for the buffer layer, the remaining third insulation film for the capacitor contact and the plug conductors, to form a bit line contact;
   (g) forming a second conductor for a bit line contact hole and a fifth insulation film for bit line definition, in this order, by exposing a second conductor pattern and a fifth insulation pattern on said top surface so that the bit line contact hole is filled by said second conductor and said fifth insulation film, wherein the second conductor for the bit line contact hole and the fifth insulation film for bit line definition have planarizing surfaces, respectively;
   (h) covering a first etch mask having a width wider than a width of the bit line contact on the upper portion of the bit line contact hole, of the surface of the fifth insulation film for the bit line definition, and then etching the fifth insulation film for bit line definition, the second conductor for the bit line and the fourth insulation film for the buffer layer to form a bit line;
   (i) removing said first etch mask and then forming a sixth insulation film for bit line insulation, and forming a third conductor for a plate node having a planarizing surface and a seventh insulation film for capacitor definition, in this order, by exposing a sixth insulation pattern, a third conductor pattern and a seventh insulation pattern on said top surface;
   (j) forming a second etch mask having a width that is the same as a width of the first etch mask at an upper part of the bit line, of the surface of the seventh insulation film for capacitor definition, and then etching the third conductor for the plate node and the seventh insulation film for capacitor definition;
   (k) forming a first dielectric film for capacitor dielectric and a fourth conductor for the storage node, in this order, by exposing a first dielectric pattern and a fourth conductor pattern on said top surface and then etching said first dielectric film and said fourth conductor together with the sixth insulation film for bit line insulation so that portions formed at the side walls of the remaining third conductor for the plate node and the seventh insulation film for capacitor definition merely remain;
   (l) forming a fifth conductor for the storage node by exposing a fifth conductor pattern on said top surface and then patterning said fifth conductor to merely remove a portion formed at the surface of the remaining seventh insulation film for capacitor definition and thus complete the storage node;
   (m) forming a second dielectric film for a capacitor dielectric by exposing a second dielectric film pattern on said top surface and then removing the remaining seventh insulation film for capacitor definition and the second dielectric film formed on the seventh insulation film to complete a capacitor dielectric; and (n) forming a sixth conductor by exposing a sixth conductor pattern on said top surface to complete the plate node.

2. A method of making a DRAM in accordance with claim 1, wherein a material of the semiconductor substrate comprises silicon.

3. A method of making a DRAM in accordance with claim 1, wherein the field insulation film comprises an oxide formed by LOCOS process.

4. A method of making a DRAM in accordance with claim 1, wherein said step (b) of forming the word line comprises the steps of:

forming a gate insulation film, a gate electrode conductor and a gate cap insulation film, in this order, on the first and second field insulation films and the active regions;

patterning the gate insulation film, the gate electrode conductor and the gate cap insulation film, thereby forming said word lines uniformly spaced from each other, respectively, on the active region and the first and second field insulation films;

forming an insulation film by exposing an insulation pattern on said top surface; and etching the insulation film, thereby forming said side wall insulation films at the side walls of the word lines.

5. A method of making a DRAM in accordance with claim 4, wherein the gate insulation film comprises a thermal oxide grown by a thermal method.

6. A method of making a DRAM in accordance with claim 4, wherein the gate electrode conductor and the gate cap insulation film are deposited by CVD method.

7. A method of making a DRAM in accordance with claim 4, wherein the side wall insulation films are formed by RIE method.

8. A method of making a DRAM in accordance with claim 4, wherein the gate electrode conductor comprises polysilicon doped with an impurity or metal.

9. A method of making a DRAM in accordance with claim 1, wherein the third insulation film for the capacitor contact, the fourth insulation film for the buffer, the fifth insulation film for bit line definition and the seventh insulation film for capacitor definition comprise nitride or oxide.

10. A method of making a DRAM in accordance with claim 1, wherein the insulation film for capacitor contact, the insulation film for buffer, the insulation film for bit line definition and the insulation film for capacitor definition are nitride or oxide.

11. A method of making a DRAM in accordance with claim 1, wherein the first conductor for the plug, the second conductor for the bit line, the conductor for storage node and the third conductor for the plate node comprise metal or polysilicon doped with an impurity.

12. A method of making a DRAM in accordance with claim 1, wherein the capacitor dielectric is a stack structure of an insulation film comprising thin insulation films including oxide-nitride, nitride-oxide and oxide-nitride-oxide.

13. A method of making a DRAM in accordance with claim 1, wherein said step(f) of forming the bit line contact comprises the steps of:

removing a portion of the third insulation film formed between two of the word lines of the active region by a dry etch method; and wet etching the first conductor for the plug and the remaining third insulation film for the capacitor contact using the remaining fourth insulation film for the buffer layer as an etch mask, thereby completely forming the bit line contact.

14. A method of making a DRAM in accordance with claim 1, wherein the second dielectric film for capacitor dielectric, the fourth conductor for the storage node and the sixth insulation film for bit line insulation are etched by RIE method.

15. A method of making a DRAM in accordance with claim 1, wherein the side wall insulation films formed at the side walls of the word lines have an etch selectively different from the etch selectivity of the fourth insulation film for the capacitor contact.

16. A method of making a DRAM in accordance with claim 1, wherein conductors, dielectric films and insulation films except for the field insulation films are all deposited by CVD method.

* * * * *